(12) United States Patent
Lin et al.

(10) Patent No.: US 9,831,338 B1
(45) Date of Patent: Nov. 28, 2017

(54) ALTERNATING SOURCE REGION ARRANGEMENT

(71) Applicant: NXP USA, Inc., Austin, TX (US)

(72) Inventors: Xin Lin, Phoenix, AZ (US); Hongning Yang, Chandler, AZ (US); Ronghua Zhu, Chandler, AZ (US); Jiang-Kai Zuo, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/430,341

(22) Filed: Feb. 10, 2017

(51) Int. Cl.
*H01L 29/78* (2006.01)
*H01L 29/10* (2006.01)
*H01L 29/08* (2006.01)
*H01L 21/266* (2006.01)
*H01L 21/265* (2006.01)
*H01L 29/66* (2006.01)

(52) U.S. Cl.
CPC ........ *H01L 29/7816* (2013.01); *H01L 21/266* (2013.01); *H01L 21/26513* (2013.01); *H01L 21/26586* (2013.01); *H01L 29/086* (2013.01); *H01L 29/0865* (2013.01); *H01L 29/0882* (2013.01); *H01L 29/1095* (2013.01); *H01L 29/66659* (2013.01); *H01L 29/66681* (2013.01); *H01L 29/7835* (2013.01)

(58) Field of Classification Search
CPC .......... H01L 29/7816; H01L 29/66681; H01L 29/0882; H01L 29/66659; H01L 29/7835; H01L 29/086; H01L 21/26513; H01L 21/266; H01L 29/0865; H01L 29/1095; H01L 21/26586
See application file for complete search history.

(56) References Cited

U.S. PATENT DOCUMENTS

| 5,382,536 | A | * | 1/1995 | Malhi | ............... | H01L 29/66659 |
| | | | | | | 148/DIG. 126 |
| 6,958,515 | B2 | | 10/2005 | Hower et al. |
| 7,268,045 | B2 | | 9/2007 | Hower et al. |
| 7,851,889 | B2 | | 12/2010 | Zhu et al. |
| 2014/0252472 | A1 | | 9/2014 | Chen et al. |

* cited by examiner

*Primary Examiner* — David Vu

(57) ABSTRACT

A semiconductor device includes a semiconductor substrate, a body region disposed in the semiconductor substrate and having a first conductivity type, a composite source region disposed in the semiconductor substrate adjacent the body region and having a second conductivity type, and a gate structure supported by the semiconductor substrate and having a side adjacent the composite source region. The composite source region includes a plurality of first constituent source regions disposed along the side of the gate structure and having the second conductivity type, and a second constituent source region disposed along the side of the gate structure and between two first constituent source regions of the plurality of first constituent source regions, the second constituent source region having the second conductivity type. The second constituent source region has a different dopant concentration level than the plurality of first constituent source regions.

24 Claims, 3 Drawing Sheets

_(1)_

ALTERNATING SOURCE REGION ARRANGEMENT

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode, as well as spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor device is a laterally diffused metal-oxide-semiconductor (LDMOS) transistor device. In an LDMOS device, a drift space is provided between the channel and the drain region.

Power devices are susceptible to the generation of secondary charge carriers through impact ionization. In an n-channel LDMOS transistor device, electrons may generate additional electron-hole pairs after being accelerated in a region having a high electric field, such as near the drain boundary. The holes are eventually collected by the body terminal of the LDMOS transistor device. If a sufficient number of holes—the secondary charge carriers—are created to raise the potential of the body of the LDMOS transistor device to an extent that the junction with the source is forward biased, activation of a parasitic npn bipolar transistor formed via the source (emitter), body (base), and drain (collector) regions of the LDMOS transistor device can occur. Very large, damaging currents can result via the activation of the parasitic bipolar transistor, an operating condition referred to as "snapback."

LDMOS devices are often characterized by a "safe operating area" in which the operating current and voltage levels are below levels that would result in a snapback event. Attempts to remain within the safe operating area to avoid device destruction or other damage are often undesirably limiting factors for device operation and application.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Figure 1:
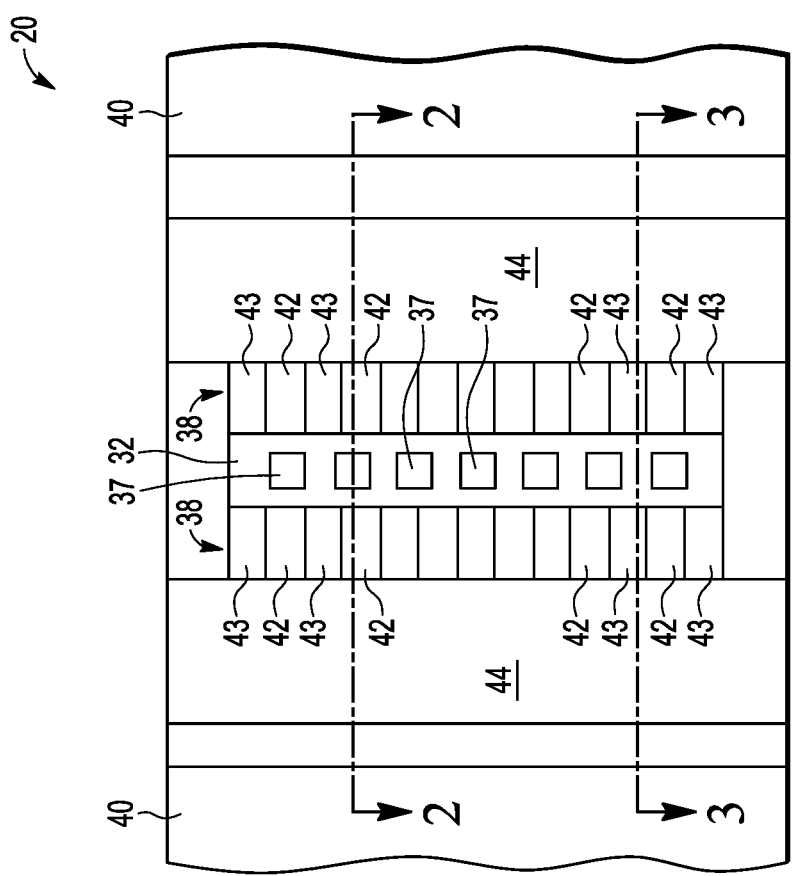
FIG. 1 is a top, schematic, partial view of an exemplary semiconductor device having a composite source region with an alternating arrangement of constituent regions to provide an increased safe operating area in accordance with one embodiment.

Semiconductor devices with composite source regions, and methods of fabricating such devices, are described. The composite source regions of the disclosed embodiments may be provided to increase the safe operating area (SOA) of the semiconductor devices. The composite source region may be used to address the generation of secondary charge carriers in power transistor devices, such as LDMOS and other transistor devices. An increased SOA allows the semiconductor device increases the range of terminal voltages and current conditions under which the device is safely operated without damage or misbehavior. Furthermore, device damage from electrostatic discharge (ESD) and other events that may otherwise give rise to snapback may be avoided. The composite source regions of the disclosed embodiments may achieve such SOA benefits with only modest increases in device on-resistance (e.g., Rdson*Area).

The composite source regions may include an alternating source arrangement involving at least two alternating constituent source regions. Each constituent source region has the same conductivity type (e.g., n-type for an n-channel device). One constituent source region may be configured as a highly doped source/drain contact region. The other constituent source region may be shallower, with a lower dopant concentration level, as described below. The shallower, more lightly doped nature of the other constituent source region helps to provide a passageway for the secondary charge carriers, as described below. The passageway effectively reduces the base resistance of the parasitic bipolar transistor structure.

The disclosed devices may also include an oppositely doped well region adjacent the shallower constituent source region. The oppositely doped well region increases the dopant concentration level of the body region near the composite source region. The increased concentration level effectively reduces the resistance for the secondary charge carriers, thereby lowering the risk of snapback. The implantation procedure used to form the well region may also counter-dope the shallower constituent source region, further reducing the depth. One or more additional (e.g., existing) dopant implantation procedures may also be used to provide a better electrical conduction path through the body region, as described below.

The composite source regions of the disclosed embodiments may be used to avoid having to resort to device size increases to address snapback concerns or improve SOA. In some embodiments, the composite source regions of the disclosed embodiments may be configured to maintain a given SOA despite a decrease in channel length or other device parameter adjustment. Relatively lower on-resistances may thus be achieved.

The composite source region may be formed using existing fabrication process steps. The dopant implantation procedures used to form the wells and other regions of, and related to, the composite source region may be dedicated to forming regions for, or otherwise configure, other devices, such as logic transistor devices and analog transistor devices. In such cases, the composite source regions are accordingly formed via changes to the layouts of the existing dopant implantation procedures. The composite source regions are thus capable of being formed without increasing fabrication costs.

The relative sizes of the constituent source regions may be adjusted to customize the device for a desired SOA and on-resistance. For example, the dimensions of the constituent source regions may be selected to tune the SOA and on-resistance. Using these dimensions, the effects on the on-resistance may be balanced with the suppression of snapback.

An increase in SOA is desirable for LDMOS and other power transistor devices, where high currents and/or high voltages are often present. Notwithstanding those advantages, and although described below in connection with n-channel LDMOS transistors, the disclosed devices are not limited to any particular transistor configuration. For instance, application of the features of the disclosed devices is not limited to LDMOS or other power MOS transistor devices. One or more features of the disclosed devices may be applied to other device configurations. The composite source region of the disclosed devices may be useful in a wide variety of transistor devices. The composite source region is also not limited to any one particular type of LDMOS configuration. For instance, the disclosed devices may have a field drift region rather than an active drift region. Other types of drift region arrangements may also be used, e.g., with various types of reduced surface field (RESURF) arrangements, including single, double, or other RESURF structural arrangements.

N-channel LDMOS devices and, thus, p-type conduction path regions are described and illustrated herein. While the improvements in SOA may be more beneficial in connection with re-channel devices (due to, e.g., less impact ionization in p-channel devices from the lower mobility of holes), the disclosed embodiments are not limited to n-channel devices. P-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

Figure 2:
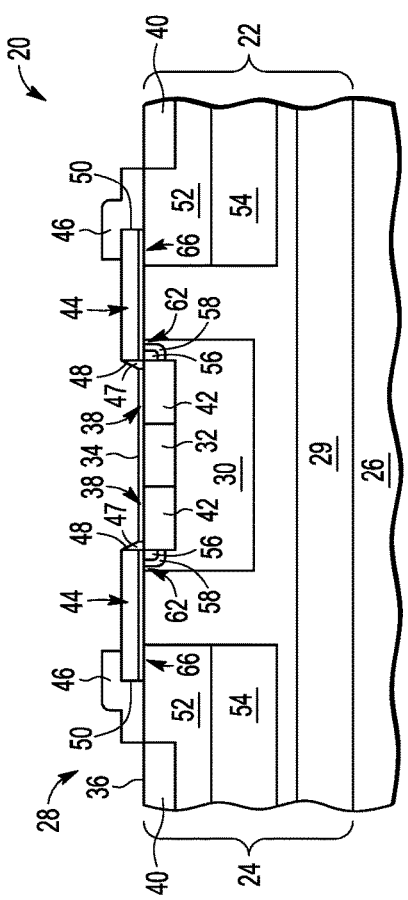
FIG. 2 is a cross-sectional, schematic, partial view of the semiconductor device of FIG. 1 taken along lines 2-2 of FIG. 1.
Figure 3:
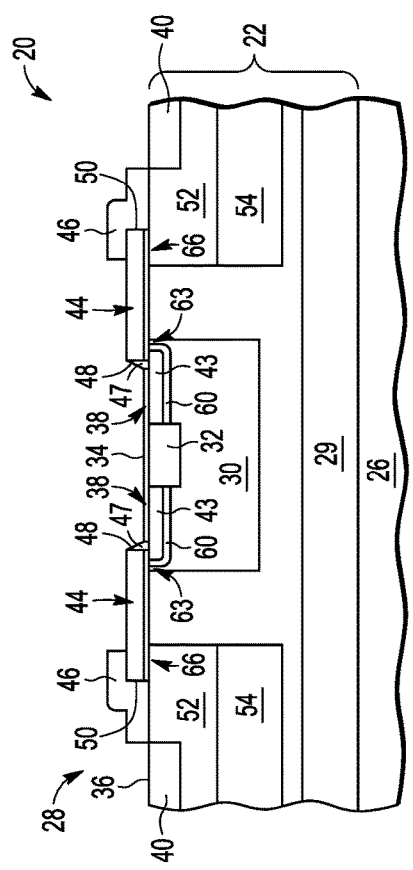
FIG. 3 is a cross-sectional, schematic, partial view of the semiconductor device of FIG. 1 taken along lines 3-3 of FIG. 1.

FIGS. 1-3 depict an n-channel LDMOS device 20 constructed in accordance with one embodiment. FIG. 1 is a partial, top view of the device 20 to show an exemplary layout of a composite source arrangement. In this example, the composite source arrangement is an alternating arrangement of constituent source regions. FIGS. 2 and 3 are partial, cross-sectional views of the device 20 to show an exemplary doping profile for the layout of the composite source arrangement. The cross-sectional view of FIG. 2 is taken along lines II-II of FIG. 1 to depict a first constituent source region of the composite source arrangement. The cross-sectional view of FIG. 3 is taken along lines of FIG. 1 to depict a second constituent source region of the composite source arrangement.

As shown in FIGS. 2 and 3, the device 20 includes a semiconductor substrate 22. The semiconductor substrate 22 may, in turn, include a number of epitaxial layers 24. In this example, the semiconductor substrate 22 includes a single p-type epitaxial layer 24 grown on an original substrate 26. The original substrate 26 may be a heavily doped p-type substrate in some cases, such as those having multiple epitaxial layers. The device 20 may alternatively or additionally include non-epitaxial layers in which one or more device regions are formed. Any one or more of the layers of the semiconductor substrate 22 may include silicon. Alternative or additional semiconductor materials may be used in other embodiments. The structural, material, and other characteristics of the semiconductor substrate 22 may vary from the example shown. For example, the semiconductor substrate 22 may include a silicon-on-insulator (SOI) construction. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A device area 28 of the device 20 is depicted in FIGS. 2 and 3. The device area 28 may correspond with the area in which the active components of the device 20 are disposed. In this case, the device area 28 is laterally symmetrical about, e.g., a body region. In some cases, the device 20 is non-symmetrical in one or more lateral dimensions. The device area 28 may be defined by one or more device isolating layers or other regions in the semiconductor substrate 22 (e.g., the epitaxial layer 24). The regions may be doped semiconductor regions and/or undoped (e.g., dielectric) regions. For example, the device area 28 may be defined at least in part by a deep-trench isolation (DTI) ring. Alternatively or additionally, the device area 28 is defined at least in part by a doped isolation barrier, e.g., an isolation tub.

The lateral symmetry may support multiple devices (e.g., devices in addition and configured similarly to the device 20) or multiple transistor structures of a single device. For example, the device 20 may share one or more components (e.g., a source or drain region) with other devices. The portion of the device area 28 shown in FIGS. 2 and 3 may be replicated any number of times (e.g., 10, 20, or more times).

One example of such lateral symmetry is shown in the top view of FIG. 1. In this example, the device 20 (or devices) are symmetrical about a source-side area (e.g., source-side active area) of the device area 28 (FIGS. 2 and 3). In single device embodiments, the source-side area is configured as a central area of the device area 28. In multiple device embodiments, the devices share a common, central source-side area. In alternative embodiments, the device 20 (or devices) are symmetrical about a common or central drain-side area. Notwithstanding the foregoing description of alternative symmetrical embodiments, the disclosed embodiments are not limited to symmetrical layouts.

The device area 28 may be defined by one or more doped device isolating layers or regions (not shown) in the semiconductor substrate 22 (e.g., the epitaxial layer 24). The doped isolating layer(s) or region(s) may laterally and/or otherwise surround the device area 28. These layers or regions act as a barrier or isolation layer separating the device area 28 from the rest of the substrate 22 (or the original substrate 26). In the example of FIGS. 2 and 3, a buried n-type layer 29 is formed or disposed in the semiconductor substrate 22. The buried n-type layer 29 may be formed in the semiconductor substrate 22 before, during, or after the growth of the epitaxial layer 24 thereof. The buried n-type layer 29 may extend laterally across (e.g., under) the device area 28 to act as a barrier or isolation layer separating the active area 28 from the original substrate 26. The buried n-type layer 29 may constitute one of multiple doped device isolating regions (not shown) surrounding the device area 28. For example, a moderately or heavily doped n-type isolation well (not shown) may laterally surround the device area 28. The isolation well may be ring-shaped. The isolation well may be disposed on or otherwise above the buried n-type layer and outside of, or along, the lateral periphery of the device area 28. Any number of the device isolation wells, sinks, or buried layers may be connected to one another. Additional, fewer, or alternative device isolation layers or regions may be provided in the semiconductor substrate 22.

The device 20 includes a device body or body region 30 (FIGS. 2 and 3) in the semiconductor substrate 22. In this embodiment, the body region 30 includes a p-type well formed in the epitaxial layer 24 of the substrate 22. The body region 30 may be biased via one or more heavily doped p-type body contact regions 32 disposed within or adjacent to the well of the body region 30. The dopant concentration of each body contact region 32 may be at a level sufficient to establish an ohmic contact with a silicide (or salicide) film 34 (FIGS. 2 and 3) at a surface 36 (FIGS. 2 and 3) of the semiconductor substrate 22. One or more body contacts 37 (FIG. 1) may be disposed on the silicide film 34 to establish an electrode for the body region 30. In this example of FIG. 1, the device 20 includes multiple body contacts 37 centered over the body contact region 32.

The silicide film 34 may be patterned or shaped as a strip as shown in FIGS. 2 and 3. The strip may extend laterally along the width of the device 20 in the source-side area. Other shapes or patterns may be used. For example, the silicide film 34 may have a shape that does not match the source-side area. One or more metal layers deposited on the surface 36 to form the silicide film 34.

One or more metal layers may be deposited to form the body contacts 37 (FIG. 1). For example, the body contacts 37 may include a metal stack. In some embodiments, the metal stack includes one or more adhesion metal layers, one or more transition metal layers, and/or one or more primary conduction metal layers. Any number of the body contacts 37 may be provided. The body contacts 37 may have any shape, and are not limited to the square shapes shown. The lateral positioning and/or arrangement of the body contacts 37 may also vary from the example shown. For instance, the body contacts 37 need not be arranged in a single line. In some embodiments, one or more additional contacts may be provided specifically for source region(s) of the device 20 described below, including, for instance, those embodiments in which the source region(s) and the body contact region 32 do not abut one another as shown.

As shown in FIGS. 1-3, the device 20 includes a composite source region 38 and a drain region 40 in the semiconductor substrate 22. In this example, the composite source region 38 includes alternating arrangement of constituent source regions 42, 43. The constituent source regions 42 and the drain region 40 are heavily doped. The constituent source regions 43 have a different (e.g., lower) dopant concentration level than the constituent source regions 42. Further details regarding the alternating arrangement and other characteristics of the constituent source regions 42, 43 of the composite source region 38 are set forth below.

In this example, the composite source and drain regions 38 and 40 are n-type doped portions of the epitaxial layer 24. The composite source and drain regions 38 and 40 are laterally spaced from one another in the lateral dimension shown in the cross-sections of FIGS. 2 and 3. That lateral dimension may be considered the length of the device 20. Such lateral spacing defines a conduction path of the device 20. The conduction path may thus be oriented along the lateral dimension shown in FIGS. 2 and 3. In some embodiments, the composite source and drain regions 38 and 40 may have additional or alternative lateral spacing. One or more drain regions 40 may be disposed laterally outward from the central, source-side area shown in FIG. 1. In alternative embodiments, a single drain region 40 is centered or otherwise disposed between, or laterally surrounded by, the composite source region 38.

In a typical n-type LDMOS configuration, the drain region 40 is biased at a relatively high drain-source voltage, Vds, relative to the composite source region 38 to support the flow of the primary charge carriers along the conduction path. The composite source and drain regions 38, 40, or respective portions thereof, may have a dopant concentration at a level sufficient to establish ohmic contacts for biasing the source region 38 and the drain region 40. In this embodiment, Ohmic contacts are established between the constituent source regions 42 and the silicide film 34. Silicide may also be disposed along the surface 36 for the drain region 40 to form an electrode with a drain contact. Upon application of the drain-source voltage (and a suitable gate bias voltage) to the drain contact, the primary charge carriers (e.g., electrons) flow along the conduction path from the composite source region 38 to the drain region 40.

The composite source region 38 may be disposed within or adjacent the well of the body region 30 (FIGS. 2 and 3). As best shown in FIG. 1, the composite source region 38 may be patterned into a number of constituent source regions 42, 43. Each constituent source region 42, 43 may be disposed adjacent the body contact region 32 as shown in FIGS. 1-3. In this example, the constituent source regions 42, 43 are disposed on both sides of the body contact region 32. Each constituent source region 42, 43 thus extends laterally outward from the body contact region 32. As shown in FIG. 1, the constituent source regions 42, 43 on each side of the body contact region 32 are distributed along a lateral direction or dimension transverse to the lateral dimension shown in the cross-sections of FIGS. 2 and 3. The constituent source regions 42, 43 may be distributed along the width of the device 20. Any number of constituent source regions 42, 43 may be provided. Further details regarding the constituent source regions 42, 43 and the composite source region 38 are provided below.

The device 20 includes one or more gate structures 44 supported by the semiconductor substrate 22. The gate structure(s) 44 are configured to control formation of a channel in the conduction path during operation. The gate structure(s) 44 may be formed on or above the surface 36 of the semiconductor substrate 22. Each gate structure 44 is disposed between the composite source region 38 and the drain region 40. In the example of FIGS. 1-3, the gate structure 44 includes two portions. The portions of the gate structure 44 may be connected at ends outside of the view of the drawing figures. The gate structure 44 may thus be ring-shaped or otherwise surround the composite source region 38. Alternatively, the gate structure 44 may be configured in a dual gate finger arrangement in which two transistors are symmetrically arranged to share the same composite source region 38 and body region 30. Still other multiple gate finger embodiments having any number of gate fingers are possible.

The gate structure 44 may include a gate dielectric layer on the surface 36. For example, the gate dielectric layer may include silicon dioxide (or oxide) deposited or otherwise formed on the surface 36. Each gate structure 44 includes a conductive gate layer (e.g., a polysilicon plate) on or above the gate dielectric layer, which insulates the conductive gate layer from the semiconductor substrate 22.

The gate structure 44 may include one or more dielectric sidewall spacers 46 (FIGS. 2 and 3) disposed along lateral, drain-side edges or sides 48 of the gate structure 44. Each sidewall spacer 46 may cover the lateral side 48 to act as a silicide blocker to prevent a silicide short along the surface 36. For example, the sidewall spacer 46 may provide spacing to separate the conductive components of the gate structure 44 from the drain region 40 and/or other regions of the device region 28. In this example, one of the sidewall spacers 46 is used for alignment purposes in defining an inner boundary of the drain region 40. A lateral, source-side edge or side 50 of the gate structure 44 may also have a sidewall spacer 47. The configuration and other characteristics of the sidewall spacers 46 may vary. For instance, the lateral extent of the sidewalls spacers 46 may vary from the example shown.

Other characteristics of the configuration of the gate structure 44 may vary. For example, the configuration of the gate structure 44 may include multiple conductive layers (e.g., polysilicon plates). Other characteristics, such as the components, materials, and shape, of the gate structure 44 may vary from the example shown.

The drain region 40 is spaced from the gate structure 44 in accordance with an active drift configuration. The device 20 includes a drift region 52 disposed between the body region 30 and the drain region 40. In this example, the drift region 52 is an n-type well. As an active drift region, the well of the drift region 52 is disposed at the surface 36 both below the gate structure 44 and between the gate structure 44 and the drain region 40.

As shown in FIGS. 2 and 3, the drift region 52 may be configured in a reduced surface field (RESURF) configuration. In this example, the device 20 includes a p-type buried well 54 adjacent a lower boundary of the drift region 52. The junction between the buried well 54 and the drift region 52 is depleted of charge carriers. The depletion of charge carriers in the drift region 52 allows the drift region 52 to protect the gate structure 44 from the high bias voltage applied to the drain region 40.

As shown in FIG. 2, the device 20 includes a terminal extension region 56 that extends laterally outward from each constituent source region 42. Each terminal extension region 56 may thus be disposed under the gate structure 44. Each terminal extension region 56 may be a intermediately or heavily doped transition region. In this n-channel example, each terminal extension region 56 is an n-type region. In some cases, each terminal extension region 56 may be formed via an implantation procedure configured to form a lightly doped drain, or NLDD, region. Alternatively or additionally, each terminal extension region 56 is or includes a diffused region formed in connection with the constituent source regions 42. The device 20 may include one or more other current terminal extension regions at or near the drain region 40 (e.g., n-type lightly doped drain, or NLDD, regions).

In the example of FIG. 2, the terminal extension region 56 is surrounded by a halo well region 58 of the device 20. In this example, the halo well region 58 is a p-type well that extends laterally under the gate structure 44 beyond the terminal extension region 56. The halo well region 58 may also extend beyond the lower boundary of the terminal extension region 56 as shown in FIG. 2. The halo well region 58 may be formed by a dopant implantation procedure having a tilt angle sufficient to dispose dopant under the gate structure 44. In some cases, the dopant implantation procedure has the same layout as the implantation procedure used to form the terminal extension region 56. The implantation procedure may thus be part of a chain implantation procedure.

With reference to FIGS. 2 and 3, the device 20 includes a halo well region 60. In this n-channel example, the halo well region 60 (FIG. 3) is a p-type well region. The halo well region 60 is disposed between the constituent source region 43 and the body region 30. As shown in FIG. 3, the halo well region 60 may extend laterally under the gate structure 44. In the example of FIG. 3, the constituent source region 43 and the halo region 60 extend laterally from the body contact region 32 to respective points under the gate structure 44. The lower boundaries of the constituent source region 43 and the halo region 60 are shallower than the lower boundary of the constituent source region 42 (FIG. 2).

The dopant implantation procedures used to form the terminal extension region 56 and the halo well region 58 may be used to form the constituent source region 43 and the halo well region 60 of the device 20. The constituent source region 43 may thus have the same dopant concentration profile (e.g., depth, concentration level, etc.) as the terminal extension region 56. The halo well regions 58, 60 may also have the same dopant concentration profile.

In other cases, one or more separate dopant implantation procedures may be used to form the constituent source region 43 and/or the halo region 60. In such cases, the dopant concentration profiles may differ accordingly. For instance, the halo region 60 may be formed with an additional p-type dopant implantation procedure. In one example, a dopant implantation procedure configured to form a p-type terminal extension region (e.g., a p-type lightly doped drain, or PLDD, region) may be used. The halo region 60 may thus have a different dopant concentration level than the halo region 58. The additional dopant implantation procedure may thus counter-dope (e.g., with p-type dopant) the constituent source regions 43 at a level greater than a dopant concentration level of the body region 30.

When the gate structure 44 is biased, charge carriers (in this case, electrons; alternatively, holes) accumulate in one or more channel areas or regions 62, 63 (FIGS. 2 and 3). Each channel region 62, 63 (or a portion thereof) may be formed during operation in the well of the body region 30 under the gate structure 44. Alternatively or additionally, the channel is formed in a portion of the epitaxial layer 24 (e.g., in cases in which the body region 30 is aligned with the gate structure 44). In this example, the accumulation of electrons results in charge inversion in the channel region 62, 63 from the p-type well of the body region 30 to an n-type conduction layer or area (or other n-channel) near the surface 36 of the semiconductor substrate 22. Once a sufficient amount of the charge carriers accumulate in the conduction layer or area, charge carriers are capable of flowing from the composite source region 38 toward the drain region 40 through the channel regions 62, 63.

The channel regions 62, 63 may include other regions or areas in the semiconductor substrate 22 in which charge inversion or accumulation occurs as a result of the bias applied to the gate structure 44. Charge carriers may also accumulate outside of or beyond the body region 30. For example, charge carriers may accumulate in a region of the epitaxial layer 24 adjacent the body region 30. This area and the channel regions 62, 63 may form part of the conduction region or path of the device 20 for the primary charge carriers (e.g., electrons).

In the example of FIGS. 2 and 3, the conduction path of the device 20 may be considered to have two conduction paths (or types of conduction paths). One conduction path may include or involve the constituent source regions 42. The other conduction path may include or involve the constituent source regions 43.

The conduction paths of the device 20 are not limited to regions in which charge inversion occurs or to regions in which conduction is enabled or enhanced via the bias voltage applied to the gate structure 44. For example, the n-type well of the drift region 52 may laterally extend under the gate structure 44 to form an accumulation region 66 of the device 20. During operation, charge carriers accumulate in the accumulation region 66 before drifting through the drift region 52.

Further details regarding the composite source region 38 and the constituent source regions 42, 43 are provided below. The constituent source regions 42, 43 are disposed along the side 50 of the gate structure 44. As shown in FIG. 1, the constituent source regions 42, 43 are disposed in an alternating arrangement along the side 50. The constituent source regions 42, 43 are disposed along a lateral direction transverse to the conduction paths described above.

The arrangement of the constituent source regions 42, 43 establishes a non-uniform source-body junction. The constituent source regions 43 differ from the constituent source regions 42 in the presence of the halo well region 60 underneath the constituent source regions 43. The thin and relatively heavy doping of the halo well region 60 provides a better (e.g., lower resistance) body connection for the device 20. The better body connection decreases the gain of the parasitic bipolar transistor structure, thereby improving the SOA of the device 20. The improved SOA is attained at the expense of a slightly higher threshold voltage and on-resistance, but without detrimentally affecting other device parameters or characteristics, such as the breakdown voltage (e.g., BVDSS) of the device 20.

The dopant concentration levels of the constituent source regions 42, 43 may help to establish a suitably low on-resistance for the device 20. The dopant concentration level of the constituent source regions 43 may be lower than that of the constituent source regions 42. For instance, the difference in dopant concentration levels between the constituent source regions 42, 43 may fall in a range from about one order of magnitude to about two orders of magnitude. Notwithstanding that difference, the dopant concentration level of the constituent source regions 43 may be sufficiently high to maintain a suitably low on-resistance for the device 20.

The number of constituent source regions 42, 43 may vary from the example shown. At least one constituent source region 43 is disposed between two constituent source regions 42, or vice versa.

In the example of FIG. 1, the constituent source regions 42, 43 have substantially equal lateral extents (e.g., widths) along the side 50 of the gate structure 44. The constituent source regions 42, 43 may thus be regularly distributed along the side 50 of the gate structure 44. In other cases, the constituent source regions 42, 43 are not be distributed along the device width dimension regularly. For instance, the constituent source regions 42, 43 may not be disposed at intervals having the same size, as in the example shown.

The size and distribution of the constituent source regions 42, 43 may be adjusted to customize the effects on SOA, on-resistance, and/or other device performance characteristics. For instance, further improvement in SOA may be achieved if the relative width of the constituent source regions 43 is greater. The improvement in SOA may be attained at the cost of an increase in on-resistance. On the other hand, the on-resistance can be lowered by increasing the relative width of the constituent source regions 42. The relative size and distribution of the constituent source regions 42, 43 thus affects a tradeoff between SOA and on-resistance. In some embodiments, the lateral width of each constituent source region 42 falls in a range from about 0.1 μm to about 2.5 μm, although other lateral widths may be used. The lateral width of each constituent source region 43 falls in a range from about 0.1 μm to about 2.5 μm, although other lateral widths may be used.

The respective shapes (e.g., layouts) of the constituent source regions 42, 43 may vary from the example shown. For example, one or both of the constituent regions 42, 43 may have a tapered shape. The shapes of the constituent source regions 42, 43 may alternatively or additionally vary as a function of position along the side 50. For example, the constituent source regions 42, 43 may be shaped differently at the ends of the gate structure 44 relative to those in the middle or interior of the gate structure 44. Any number of constituent source regions 42, 43 may be provided along the side 50.

The composite source regions 38 of the above-described embodiments may or may not include a transition or extension region, or have one associated therewith. The composite source regions may or may not include an extension or transition region that extends laterally outward (e.g., toward or into the channel) or that extends under the region doped by the source/drain implant. For instance, the embodiments described and shown in connection with FIGS. 1-3 need not have an extension region. In such cases, a different implantation procedure may be used to form the constituent source region 43.

The above-described devices are shown in simplified form. For example, FIGS. 1-3 do not show all of the contacts and other conductive (e.g., metal) layers or structures configured for electric coupling with the source regions, the drain regions, and the gate structures. The devices may have a number of other structures or components for connectivity, isolation, passivation, and other purposes not shown in the figures for ease in illustration. For instance, the devices may include any number of additional doped isolating regions (e.g., an isolation ring) or layers (e.g., a buried isolation layer). In some examples, another p-type epitaxial layer (not shown) may be disposed between the original substrate and the device area. One or more further STI regions, other isolation trenches, and/or isolation wells (not shown) may be provided to isolate the device area and/or other region of the device.

The dopant concentrations, thicknesses, and other characteristics of the above-described semiconductor regions in the semiconductor substrate 22 may vary. In one example of the embodiment shown in FIGS. 1-3, the above-referenced semiconductor regions may have the following approximate concentrations and thicknesses:

|  | Concentration | Thickness |
| --- | --- | --- |
| epitaxial 24: | $1 \times 10^{13}$-$1 \times 10^{16}$/cm$^3$ | 1-10 μm |
| substrate 26: | $1 \times 10^{15}$-$1 \times 10^{19}$/cm$^3$ | not applicable |
| well 30: | $1 \times 10^{15}$-$5 \times 10^{18}$/cm$^3$ | 0.5-3.0 μm |
| region 32: | $1 \times 10^{20}$-$1 \times 10^{23}$/cm$^3$ | 0.1-0.5 μm |
| drain 40: | $1 \times 10^{20}$-$1 \times 10^{23}$/cm$^3$ | 0.1-0.5 μm |
| region 42: | $1 \times 10^{20}$-$5 \times 10^{23}$/cm$^3$ | 0.1-0.5 μm |
| region 43: | $1 \times 10^{18}$-$1 \times 10^{22}$/cm$^3$ | 0.05-0.5 μm |
| drift 52: | $1 \times 10^{15}$-$5 \times 10^{17}$/cm$^3$ | 0.5-5.0 μm |
| well 54: | $1 \times 10^{15}$-$5 \times 10^{17}$/cm$^3$ | 0.5-5.0 μm |
| NLDD 56: | $1 \times 10^{18}$-$1 \times 10^{21}$/cm$^3$ | 0.1-0.5 μm |

-continued

|  | Concentration | Thickness |
|---|---|---|
| halo 58: | $1 \times 10^{17}$-$1 \times 10^{20}$/cm$^3$ | 0.01-0.5 μm |
| halo 60: | $1 \times 10^{17}$-$1 \times 10^{20}$/cm$^3$ | 0.01-0.5 μm |

The concentrations and thicknesses may be different in other embodiments. For example, the dopant concentration of the original substrate 26 may vary considerably. Any dopant materials may be used to form the above-described semiconductor regions in the semiconductor substrate 22.

The configuration of the drain-side of the device 20 may vary from the example shown in FIGS. 1-3. For example, in some cases, a shallow trench isolation (STI) region or other dielectric region may be formed at the surface 36 between the gate structure 44 and the drain region 40 in, e.g., field drift configuration. The STI region may be used to space the gate structure 44 from the high voltage applied to the drain region 40. The STI region may be configured to prevent or minimize hot carrier injection (HCI) into the oxide layer of the gate structure 44.

The configuration of the source side of the device 20 may also vary from the example shown. For example, a number of other STI regions may be formed at the surface 36. For example, another STI region may be disposed between the body contact region 32 and the source region 38. The body contact region 32 and the source region 38 thus need not abut one another as shown.

Other STI regions may be disposed in the semiconductor substrate 22 to isolate or separate various contact regions, such as other regions for biasing components of the device 20. For example, an STI region may be used to separate an isolation contact region from a substrate contact region.

Figure 4:
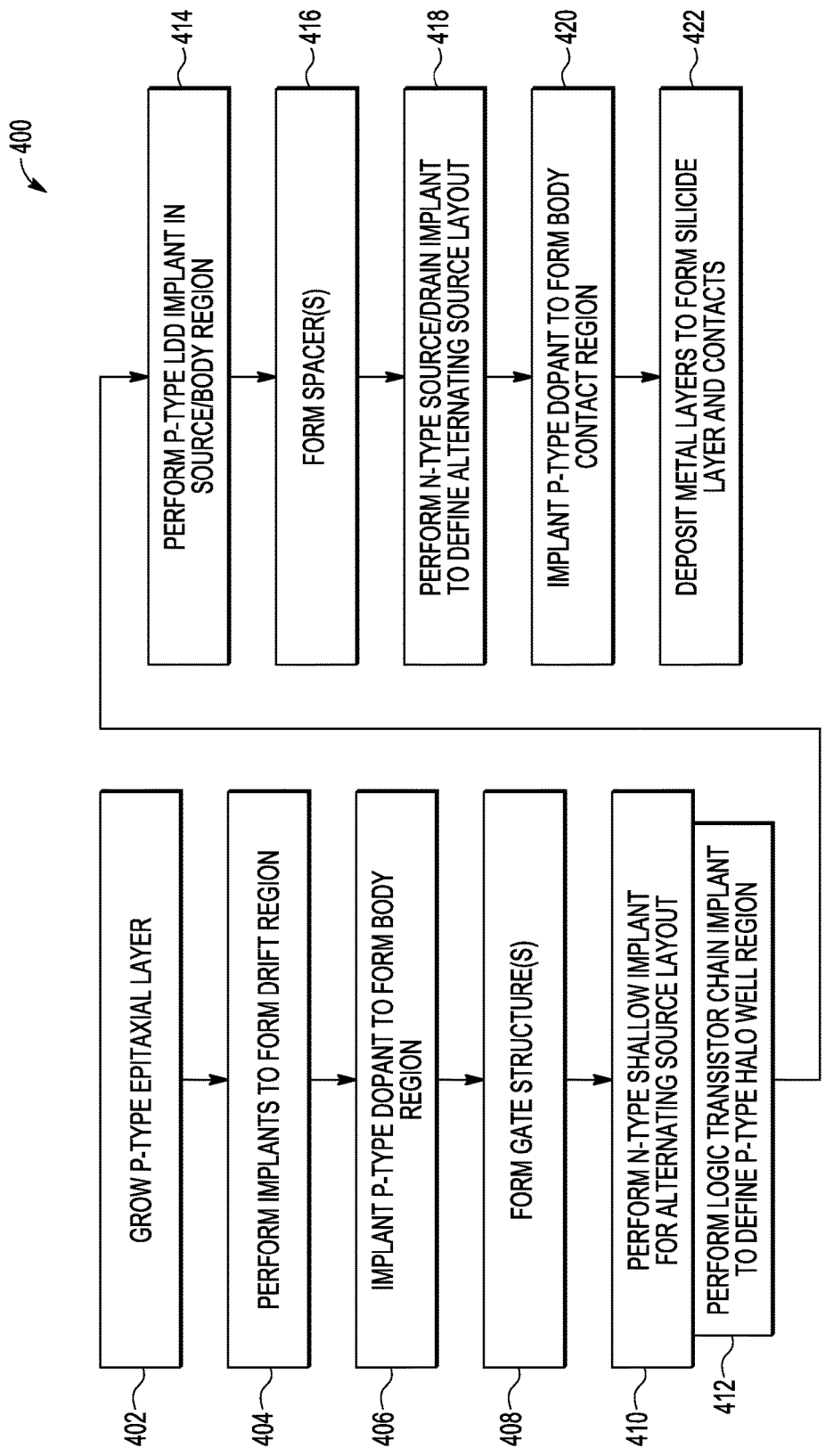
FIG. 4 is a flow diagram of an exemplary fabrication sequence to construct a semiconductor device having a composite source region with an alternating arrangement of constituent regions in accordance with one embodiment.

FIG. 4 shows an exemplary fabrication method 400 for fabricating a semiconductor device with an improved SOA as described above. The method 400 may be directed to fabricating a transistor device, such as a power FET device (e.g., an LDMOS device) having one or more of the features described above. The transistor device is fabricated with a semiconductor substrate, the regions or layers of which may have the conductivity types of the n-channel examples described above, or be alternatively configured to support a p-channel device. The method includes a sequence of acts, only the salient of which are depicted for convenience in illustration. The ordering of the acts may vary in other embodiments. For example, the drift region may be formed after the body region. The fabrication method 400 is not limited to any particular doping mechanism, and may include future developed doping techniques.

The method 400 may begin with, or include, an act 402 in which a p-type epitaxial layer is grown on a heavily doped p-type semiconductor substrate. In some cases, the act 400 includes the formation via, e.g., ion implantation, of one or more buried device isolation layers before the growth of the epitaxial layer. The buried device isolation layer(s) may be configured via a mask to extend across an active area of the transistor device. In some cases, the act 400 includes the growth of another p-type epitaxial layer. Any number of epitaxial layers may be grown. Alternatively, no epitaxial layers are grown.

In some cases, a number of STI regions are formed in the substrate at a surface established by the act 402. The STI regions may include an STI region (or field isolation region) to define a field drift length, and one or more STI regions to separate various contact regions. The STI regions may be formed via any now known or hereafter developed procedure. For example, the STI regions may be formed in a trench in which one or more materials are deposited via, e.g., chemical vapor deposition, (CVD). In some embodiments, the trench is filled with silicon oxide. Additional or alternative materials may be deposited. In an alternative embodiment, one or more of the STI regions are formed after the drift region is formed.

In act 404, the substrate is doped to form a well in the epitaxial layer for the accumulation region and the drift region of the transistor device. The well is an n-type well in re-channel embodiments. The doping may include one or more n-type dopant implantation procedures. In some cases, the act 404 includes the formation of a buried well below the drift region to provide a RESURF or other depletion arrangement. One or more p-type dopant implantation procedures may be performed.

A well of a body region may be formed in the substrate in an act 406. The act 406 may include one or more p-type implantation procedures. The characteristics of the body and drift well regions may vary. For example, the drift region well may be spaced from the device body well. In other embodiments, the boundary of the well may be line-on-line with a boundary of the device body. In other embodiments, the drift region well and the device body well may have a certain overlap, The fabrication process may then include one or more procedures collectively shown in act 408 and directed to forming a gate structure. A gate oxide layer of the gate structure may be deposited or grown on a surface of the semiconductor substrate. A polysilicon or other conductive layer of the gate structure may then be deposited on the gate oxide layer. The layers of the gate structure may be patterned via various photolithography and etch procedures.

Additional or alternative procedures may be implemented in the act 408. For example, sidewall spacers of the gate structure may then be formed after implementation of the NLDD or other implant. The material(s), size, shape, and other characteristics of the sidewall spacers may vary.

In the example of FIG. 4, a number of acts are then implemented to form a composite source region as described above. The acts include multiple source implantation procedures, including a principal source implantation procedure and a supplementary (or auxiliary) source implantation procedure. The terms "principal" and "supplementary" and "auxiliary" are used herein to distinguish between the respective implantation procedures without indicating any difference in significance of one procedure relative to another. The terms are also not necessarily indicative of the order in which the implantation procedures are implemented. For instance, in the example of FIG. 4, the supplementary implantation procedure is implemented before the principal implantation procedure. The acts may include further implantation procedures directed to forming wells or other regions associated with the composite source region.

The supplementary source implantation procedure is performed in an act 410 to form supplementary or auxiliary constituent source regions of the composite source region. The supplementary constituent source regions may define a portion of an alternating arrangement of constituent source regions. As described above, the layout of the supplementary source implantation procedure may be configured such that the supplementary constituent source regions are disposed along a side of the gate structure. In an n-channel example, the supplementary constituent source regions have a second conductivity type.

The act 410 includes an act 412 in which a halo well region is formed around the supplementary constituent source regions. The halo well region has the opposite conductivity type than the supplementary constitute source regions (e.g., a p-type halo well region). The halo well region may be formed via a dopant implantation procedure with the same layout as the dopant implantation procedure used to form the supplementary constituent source regions. The dopant implantation procedures of the acts 410, 412 may thus be chain implantation procedures that share a common mask.

The implantation procedure of the act 412 may be or include a halo implantation procedure having a tilt angle such that the halo well region formed thereby extends under the gate structure. In some cases, the supplementary source implantation procedure and the halo implantation procedure of the acts 410, 412 correspond with pre-existing implantation procedures of the fabrication process. For example, the supplementary source implantation procedure and the halo implantation procedure may be used to establish the threshold voltage of a logic transistor device formed in the semiconductor substrate and/or help to prevent punch-through between the source and drain in such logic transistor devices.

The layout of the implantation procedures of the acts 410, 412 may include or exclude the areas in which the principal constituent source regions are formed. The implantation procedures of the acts 412, 414 may thus have layouts that overlap or do not overlap with the layout(s) of the principal implantation procedures, as described below in connection with an act 418. In the former case, the dopant implanted in the act 418 may establish a dopant concentration level significantly higher than those established by the implantation procedures of the acts 410, 412. The overlapping nature of the layouts is accordingly rendered moot, while removing the risk of layout misalignment.

The method may include an act 414 in which a dopant implantation procedure is performed counter-dope the supplementary constituent source regions and increase a dopant concentration level of the halo well region. In the n-channel examples, the procedure implants p-type dopant. In some cases, the implantation procedure of the act 414 is a pre-existing implantation procedure configured to modify a channel of an analog transistor device formed in the semiconductor substrate. For example, the pre-existing implantation procedure may be a PLDD implantation procedure.

In the example of FIG. 4, one or more spacer structures are formed in an act 416. The spacers may be disposed along an edge of the gate structure, as described above. In some cases, each respective one of the spacers is formed along a drain-side edge of each gate structure. The spacers may include any one or more dielectric materials.

In an act 418, a principal source implantation procedure is performed to form principal constituent source regions of a composite source region adjacent the body region. The principal constituent source regions may define a portion of the alternating arrangement of constituent source regions. As described above, the layout of the principal source implantation procedure may be configured such that the principal constituent source regions are disposed along a side of the gate structure. The principal constituent source regions are disposed along the same side of the gate structure as the supplementary constituent source regions. An alternating source layout arrangement may thus be established, as described above. The principal source implantation procedure is configured such that the principal constituent source regions have the same conductivity type as the supplementary constituent source regions. In an n-channel example, the principal constituent source regions have a second conductivity type. The principal and supplementary source implantation procedures may be configured such that the supplementary constituent source regions have a shallower lower boundary than the principal constituent source regions.

The principal implantation procedure of the act 418 may also be used to form a drain region(s) of the device. The principal implantation procedure of the act 418 may thus be a source/drain implantation procedure. As a result, the principal constituent source regions have a high dopant concentration level corresponding to that of the drain region. Furthermore, in such cases, the layout of the principal implantation procedure of the act 418 is configured with gaps for the supplementary constituent source regions.

One or more dopant implantation procedures of the acts 410, 412, 414, and 418 may be implemented during and/or after the act 408. For example, one or more dopant implantation procedures may be implemented after the formation of a portion of the gate structures. For instance, one or more of the acts 410, 412, 414, and 418 may be implemented before and/or after the formation in the act 416 of the sidewall spacers of the gate structures.

In an act 420, a body contact region is formed in the semiconductor substrate via, e.g., a p-type dopant implantation procedure. A mask used for the dopant implantation procedure may be configured such that dopant (e.g., p-type dopant) is not implanted in the areas of the source region.

One or more metal layers may be deposited in an act 422 to form a silicide film (or salicide layer) over the source and body contact regions. The act 422 may also include the deposition of one or more further metal layers to form contacts for the source, body contact, and drain regions. A variety of metals may be used.

Additional acts may be implemented at various points during the fabrication procedure. For example, one or more acts may be directed to defining an active area of the device. In some cases, such acts may include the formation of one or more device isolating wells, layers, or other regions. One or more passivation layers may be deposited. Any number of additional STI regions may be formed.

Described above are transistor devices and fabrication methods involving a composite source region for improved SOA. In some cases, the transistor devices are LDMOS (e.g., NLDMOS) or other power transistor devices. A source/body tie area of the transistor devices includes a body contact region (e.g., a p+ region) and two alternating constituent source regions (e.g., n+ regions) connected by a silicide layer. The first constituent source regions have higher dopant concentration and larger junction depth relative to the second constituent source regions. A heavily doped and thin well region (e.g., a p-type layer) is formed beneath the second constituent source regions, which effectively lowers the impedance of the conduction path of the secondary charge carriers, thereby improving the SOA of the transistor device. The use of two constituent source regions of the same conductivity type helps to reduce or minimize any adverse effect on the on-resistance of the transistor device.

For convenience of description and without any intended limitation, n-channel LDMOS devices with a p-type substrate are described and illustrated. However, the disclosed devices are not limited to p-type substrates, such that other types of devices may be provided by, for example, substitution of semiconductor regions of opposite conductivity type. Thus, for example, each semiconductor region, layer or other structure in the example described in connection with FIGS. 1-3 may have a conductivity type (e.g., n-type or p-type) opposite to the type identified in the examples below.

In a first aspect, a semiconductor device includes a semiconductor substrate, a body region disposed in the semiconductor substrate and having a first conductivity type, a composite source region disposed in the semiconductor substrate adjacent the body region and having a second conductivity type, and a gate structure supported by the semiconductor substrate and having a side adjacent the composite source region. The composite source region includes a plurality of first constituent source regions disposed along the side of the gate structure and having the second conductivity type, and a second constituent source region disposed along the side of the gate structure and between two first constituent source regions of the plurality of first constituent source regions, the second constituent source region having the second conductivity type. The second constituent source region has a different dopant concentration level than the plurality of first constituent source regions.

In a second aspect, a semiconductor device includes a semiconductor substrate, a body region disposed in the semiconductor substrate and having a first conductivity type, a composite source region disposed in the semiconductor substrate adjacent the body region and having a second conductivity type, and a drain region disposed in the semiconductor substrate, having the second conductivity type, and spaced from the source region to define a conduction path. The composite source region includes a plurality of first constituent source regions disposed along a lateral direction transverse to the conduction path and having the second conductivity type, and a plurality of second constituent source regions disposed along the lateral direction in an alternating arrangement with the plurality of first constituent source regions, the second constituent source region having the second conductivity type. Each second constituent source region of the plurality of second constituent source regions has a different dopant concentration level than each first constituent source region of the plurality of first constituent source regions.

In a third aspect, a method of fabricating a semiconductor device includes forming a body region in a semiconductor substrate, the body region having a first conductivity type, forming a gate structure supported by the semiconductor substrate, and performing a first source implantation procedure to form first constituent source regions of a composite source region adjacent the body region, the first constituent source regions being disposed along a side of the gate structure, the first constituent source regions having a second conductivity type, and performing a second source implantation procedure to form second constituent source regions of the composite source region, the second constituent source regions being disposed along the side of the gate structure, the second constituent source regions having the second conductivity type. The first and second constituent source implantations are configured such that the first constituent source regions are disposed in an alternating arrangement with the second constituent source regions along the side of the gate structure.

References to a well region or other doped region of a semiconductor having a certain conductivity type are intended to specify that the region has a net dopant concentration of the type indicated to support the indicated conductivity type. The region may have dopant of the other conductivity type therein, but the amount of such opposite dopant is insufficient to change the effective, or net, conductivity type of the region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A semiconductor device comprising:
a semiconductor substrate;
a body region disposed in the semiconductor substrate and having a first conductivity type;
a composite source region disposed in the semiconductor substrate adjacent the body region and having a second conductivity type; and
a gate structure supported by the semiconductor substrate and having a side adjacent the composite source region;
wherein the composite source region comprises:
a plurality of first constituent source regions disposed along the side of the gate structure and having the second conductivity type; and
a second constituent source region disposed along the side of the gate structure and between two first constituent source regions of the plurality of first constituent source regions, the second constituent source region having the second conductivity type;
wherein the second constituent source region has a different dopant concentration level than the plurality of first constituent source regions.

2. The semiconductor device of claim 1, wherein:
the second constituent source region is one of a plurality of second constituent source regions of the composite source region; and
the plurality of first constituent source regions and the plurality of second constituent source regions are disposed in an alternating arrangement along the side of the gate structure.

3. The semiconductor device of claim 1, wherein the second constituent source region has a shallower lower boundary and a lower dopant concentration level than the plurality of first constituent source regions.

4. The semiconductor device of claim 1, further comprising a well region having the first conductivity type and disposed between the second constituent source region and the body region.

5. The semiconductor device of claim 4, wherein the well region laterally extends under the gate structure.

6. The semiconductor device of claim 1, wherein the second constituent source region is counter-doped with dopant of the first conductivity type at a level greater than a dopant concentration level of the body region.

7. The semiconductor device of claim 1, wherein the second constituent source region and each first constituent source region of the plurality of first constituent source regions have substantially equal lateral extents along the side of the gate structure.

8. The semiconductor device of claim 1, wherein the plurality of first constituent source regions are regularly distributed along the side of the gate structure.

9. The semiconductor device of claim 1, wherein a difference in dopant concentration levels of the second constituent source region and each first constituent source region of the plurality of first constituent source regions falls in a range from about one order of magnitude to about two orders of magnitude.

10. A semiconductor device comprising:
a semiconductor substrate;
a body region disposed in the semiconductor substrate and having a first conductivity type;
a composite source region disposed in the semiconductor substrate adjacent the body region and having a second conductivity type; and
a drain region disposed in the semiconductor substrate, having the second conductivity type, and spaced from the source region to define a conduction path;
wherein the composite source region comprises:
a plurality of first constituent source regions disposed along a lateral direction transverse to the conduction path and having the second conductivity type; and
a plurality of second constituent source regions disposed along the lateral direction in an alternating arrangement with the plurality of first constituent source regions, the second constituent source region having the second conductivity type;
wherein each second constituent source region of the plurality of second constituent source regions has a different dopant concentration level than each first constituent source region of the plurality of first constituent source regions.

11. The semiconductor device of claim 10, wherein each second constituent source region of the plurality of second constituent source regions has a shallower lower boundary and a lower dopant concentration level than each first constituent source region of the plurality of first constituent source regions.

12. The semiconductor device of claim 10, further comprising a plurality of well regions, each well region having the first conductivity type and disposed between the body region and a respective second constituent source region of the plurality of second constituent source regions.

13. The semiconductor device of claim 12, wherein each well region laterally extends beyond the respective second constituent source region toward the drain region along the conduction path.

14. The semiconductor device of claim 10, wherein each second constituent source region of the plurality of second constituent source regions is counter-doped with dopant of the first conductivity type at a level greater than a dopant concentration level of the body region.

15. The semiconductor device of claim 10, wherein each first constituent source region of the plurality of first constituent source regions and each second constituent source region of the plurality of second constituent source regions have substantially equal lateral extents along the lateral direction.

16. The semiconductor device of claim 10, wherein the plurality of first constituent source regions and the plurality of second constituent source regions are regularly distributed along the lateral direction.

17. A method of fabricating a semiconductor device, the method comprising:
forming a body region in a semiconductor substrate, the body region having a first conductivity type;
forming a gate structure supported by the semiconductor substrate;
performing a first source implantation procedure to form first constituent source regions of a composite source region adjacent the body region, the first constituent source regions being disposed along a side of the gate structure, the first constituent source regions having a second conductivity type; and
performing a second source implantation procedure to form second constituent source regions of the composite source region, the second constituent source regions being disposed along the side of the gate structure, the second constituent source regions having the second conductivity type;
wherein the first and second constituent source implantations are configured such that the first constituent source regions are disposed in an alternating arrangement with the second constituent source regions along the side of the gate structure.

18. The method of claim 17, further comprising performing a halo implantation procedure to form well regions having the first conductivity type, each well region being disposed between a respective one of the second constituent source regions and the body region.

19. The method of claim 18, wherein the halo implantation procedure and the second source implantation procedure are chain implantation procedures sharing a common mask.

20. The method of claim 18, wherein the halo implantation procedure and the second source implantation procedure are configured to establish a threshold voltage of a logic transistor device formed in the semiconductor substrate.

21. The method of claim 18, wherein the halo implantation procedure has a tilt angle such that the well region extends under the gate structure.

22. The method of claim 18, further comprising performing a further implantation procedure to counter-dope the second constituent source regions with dopant of the first conductivity type and increase a dopant concentration level of the well regions.

23. The method of claim 22, wherein the further implantation procedure is configured to modify a channel of an analog transistor device formed in the semiconductor substrate.

24. The method of claim 22, wherein the further implantation procedure and the first source implantation procedure have non-overlapping layouts.

* * * * *